United States Patent [19]
Sohn

[11] Patent Number: 5,606,280
[45] Date of Patent: Feb. 25, 1997

[54] BAND-PASS FILTER SYSTEM

[75] Inventor: Ki S. Sohn, Kyungki-do, Rep. of Korea

[73] Assignee: LG Semicon Co., Ltd., Chungcheongbuk-do, Rep. of Korea

[21] Appl. No.: 540,394

[22] Filed: Oct. 6, 1995

[30] Foreign Application Priority Data

Oct. 6, 1994 [KR] Rep. of Korea .............. 25540/1994

[51] Int. Cl.⁶ .................. H03K 5/00; H03H 7/12
[52] U.S. Cl. .................. 327/553; 327/552; 327/557; 327/103; 327/148; 327/157; 330/109; 333/174
[58] Field of Search .................... 327/103, 551, 327/552, 553, 555, 556, 557, 558, 559, 147, 156, 157, 2, 7, 8, 148; 330/107, 109, 294; 333/174

[56] References Cited

U.S. PATENT DOCUMENTS

| | | | |
|---|---|---|---|
| 3,644,847 | 2/1972 | Neuman | 327/552 |
| 4,162,461 | 7/1979 | Wallis et al. | 327/552 |
| 4,302,738 | 11/1981 | Cabot et al. | 327/553 |
| 4,663,583 | 5/1987 | Ludwick et al. | 323/217 |

*Primary Examiner*—Timothy P. Callahan
*Assistant Examiner*—Dinh T. Le
*Attorney, Agent, or Firm*—Morgan, Lewis and Bockius LLP

[57] ABSTRACT

A band-pass filter system comprises a band-pass filter, and a frequency band controller for controlling a frequency band of the band-pass filter by generating a corresponding up pulse voltage and a down pulse voltage according to a pre-controlled center frequency obtained from an output frequency of the band-pass filter to produce a control frequency for obtaining a desired center frequency of the band-pass filter.

13 Claims, 6 Drawing Sheets

BAND-PASS FILTER SYSTEM

BACKGROUND OF THE INVENTION

1. Field of the Invention

The present invention relates to a band-pass filter (BPF), and more particularly, to controlling a BPF's center frequency.

2. Discussion of the Related Art

Figure 1:
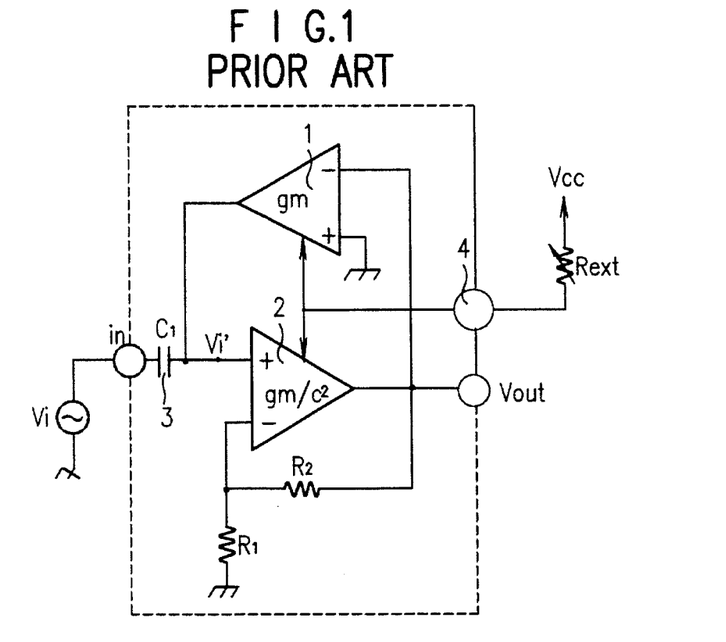
FIG. 1 is a circuit diagram of a conventional band-pass filter.

FIG. 1 shows a configuration of a conventional BPF. As shown in FIG. 1, a conventional BPF is constructed in such a manner that one end of a capacitor C1 is coupled to the input port in of an AC voltage source Vi, the other end of capacitor C1 is coupled to the noninverting input port + of a transconductance amplifier 2, the inverting input port − of transconductance amplifier 2 is coupled to the output port of transconductance amplifier 2 via a resistor R2, a resistor R1 is coupled to the inverting input port − of transconductance amplifier 2 and the ground, the inverting input port − of transconductance amplifier 1 is coupled to the output port of transconductance amplifier 2, the noninverting input port + of transconductance amplifier 1 is coupled to ground, the noninverting input port + of transconductance amplifier 2 is coupled to the output port of transconductance amplifier 1, and a variable resistor Rext is coupled between a power source Vcc and filter controlling port 4. In short, the center frequency f0 of conventional BPF is controlled by feeding back transconductance amplifiers 1 and 2 and controlling variable resistor Rext.

Figure 2:
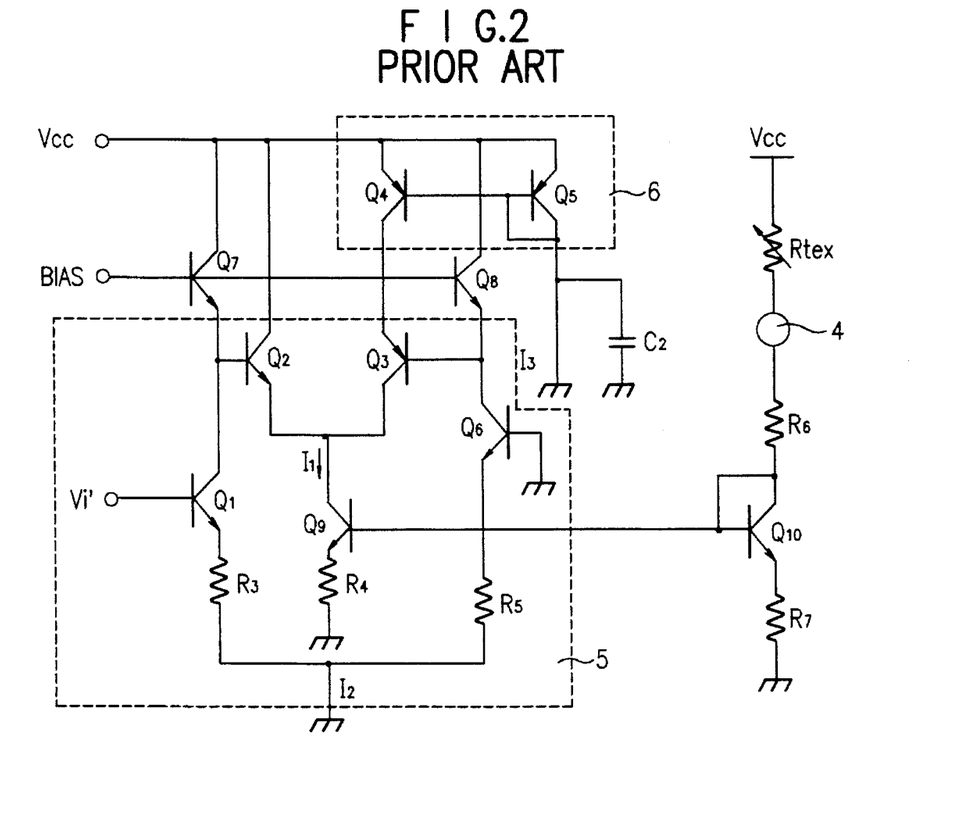
FIG. 2 is an equivalent circuit diagram of a conventional transconductance amplifier.

FIG. 2 is an equivalent circuit diagram of transconductance amplifier 2 of FIG. 1. In FIG. 2, the equivalent circuit of transconductance amplifier 2 consists of a pnp transistor Q5 whose emitter is coupled to power Vcc and whose collector and base are coupled to the ground, a pnp transistor Q4 whose emitter is coupled to power Vcc and whose base is coupled to the base and collector of pnp transistor Q5, a capacitor C2 coupled to the collector of pnp transistor Q5 and the ground, an npn transistor Q7 whose collector is coupled to power Vcc and whose base is coupled to a bias input BIAS, an npn transistor Q8 whose collector is coupled to power Vcc and whose base is coupled to bias input BIAS, an npn transistor Q2 whose base is coupled to the emitter of npn transistor Q7 and whose collector is coupled to power Vcc, an npn transistor Q3 whose collector is coupled to the collector of pnp transistor Q4 and whose base is coupled to the emitter of npn transistor Q8, an npn transistor Q6 whose collector is coupled to the emitter of npn transistor Q8 and whose base is coupled to the ground, a resistor R5 coupled to the emitter of npn transistor Q6 and the ground, a variable resistor Rext coupled to power Vcc and filter controlling port 4, an npn transistor Q10 whose collector and base are coupled to filter controlling port 4 via resistor R6 and whose emitter is coupled to the ground via resistor R7, an npn transistor Q9 whose collector is coupled to the emitter of npn transistors Q2 and Q3, whose base is coupled to filter controlling port 4 and whose emitter is coupled to the ground via resistor R4, and an npn transistor Q1 whose base is coupled to input voltage Vi' whose collector is coupled to the emitter of transistor Q7 and whose emitter is coupled to the ground via resistor R3.

Here, pnp transistors Q4 and Q5 form a current mirror 6, while npn transistors Q1, Q2, Q3, Q6, and Q7 and resistors R3, R4, and R5 form a differential amplifier 5. An input/output transfer function Av(S) and center frequency f0 of the conventional BPF of FIGS. 1 and 2 are given in the following equations.

First, the Laplace-transformed input/output transfer function of the BPF is:

$$Av(S) = \frac{Vo(S)}{Vi(S)} = \frac{\left(\frac{S}{Wo}\right)}{\left(\frac{S}{Wo}\right)^2 + \left(\frac{1}{\theta}\right)\left(\frac{S}{Wo}\right) + 1} \quad (1)$$

$$Wo = 2\pi f o = \frac{GM}{C} \quad (2)$$

where GM indicates the ratio of input voltage and output current.

$$\theta = \frac{R_1}{R_1 + R_2} \quad (3)$$

Center frequency f0 is determined by the ratio (GM) of input/output current of transconductance amplifier 2. As shown in FIG. 2, input/output current ratio GM is obtained by:

$$GM = \frac{Io}{Vi'} = \frac{1}{2R_3} \cdot \frac{I_1}{I_2} \quad (4)$$

Center frequency f0 is given by the following equation according to equations 2 and 4:

$$f0 = \frac{1}{2\pi} \times \frac{GM}{C} = \frac{1}{4\pi C R_3} \times \frac{I_1}{I_2} \quad (5)$$

When variable resistor Rext between power Vcc and filter controlling port 4 is controlled, currents flowing through npn transistor Q8 are converted, and current $I_1$ is changed by the current mirror of npn transistors Q4 and Q5. Thus, center frequency f0 is controlled in accordance with equation 5. In other words, when variable resistor Rext is controlled, center frequency f0 of the conventional BPF is controlled. However, in the conventional BPF, resistors, condensers, and constant current devices have deviations so that center frequency f0 must be controlled initially, increasing the number of processes, production cost, and processing time on the production line.

SUMMARY OF THE INVENTION

Accordingly, the present invention is directed to a nonadjusting band-pass filter that substantially obviates one or more of the problems due to limitations and disadvantages of the related art.

Additional features and advantages of the invention will be set forth in the description which follows, and in part will be apparent from the description, or may be learned by practice of the invention. the objectives and other advantages of the invention will be realized and attained by the structure particularly pointed out in the written description and claims hereof as well as the appended drawings.

To achieve these and other advantages and in accordance with the purpose of the invention, as embodied and broadly described, the present invention provides for a band-pass filter, and a frequency band controller for controlling a frequency band of the band-pass filter by generating a corresponding up pulse voltage and a down pulse voltage according to a pre-controlled center frequency obtained from an output frequency of the band-pass filter to produce a control frequency for obtaining a desired center frequency of the band-pass filter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
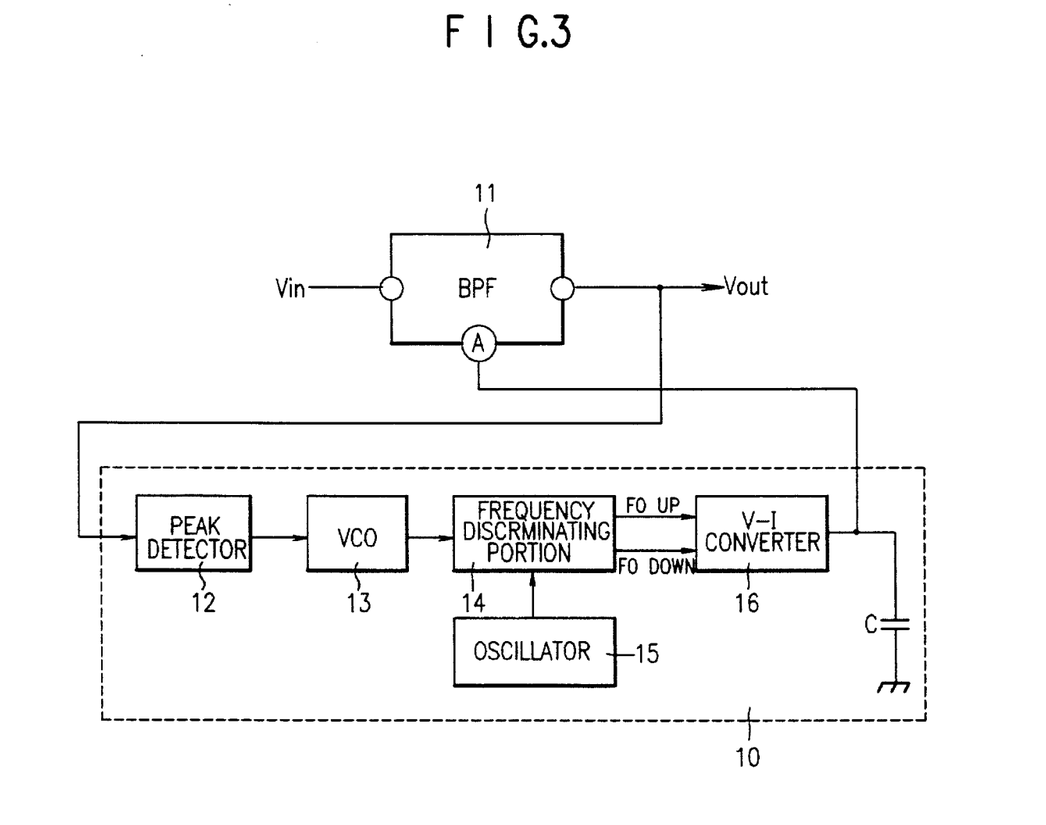
FIG. 3 is a block diagram of a non-adjusting band-pass filter of the present invention.

As shown in FIG. 3, a non-adjusting band-pass filter of the present invention comprises a band-pass filter 11 and frequency band controller 10. Band-pass filter 11 performs filtering by passing only a specific band of frequency according to the control of frequency band controller 10. Frequency band controller 10 controls the frequency band of band-pass filter 11 by generating a corresponding up/down pulse voltage in order to produce a control frequency for obtaining a desired center frequency f0 according to center frequency f0' obtained from the output of band-pass filter 11.

Frequency band controller 10 comprises a peak detector 12 for outputting a DC voltage proportional to the peak of the output frequency of band-pass filter 11, a voltage controlled oscillator (VCO) 13 for outputting pre-controlled center frequency f0' corresponding to the DC voltage output from peak detector 12, an oscillator 15 for generating a reference clock corresponding to desired center frequency f0, a frequency discriminating portion 14 for comparing pre-controlled center frequency f0' output from VCO 13 and desired center frequency f0 of the reference clock output from oscillator 15 to output an up/down pulse voltage corresponding to a control frequency for obtaining desired center frequency f0, a V-I converter 16 for converting the up/down pulse voltage output from frequency discriminating portion 14 into a current, and a capacitor C, one end of which is coupled to the ground, for performing charging/discharging according to the current output from V-I converter 16 and outputting the result to frequency band control port A of band-pass filter 11 in order to control the frequency band.

Figure 4:
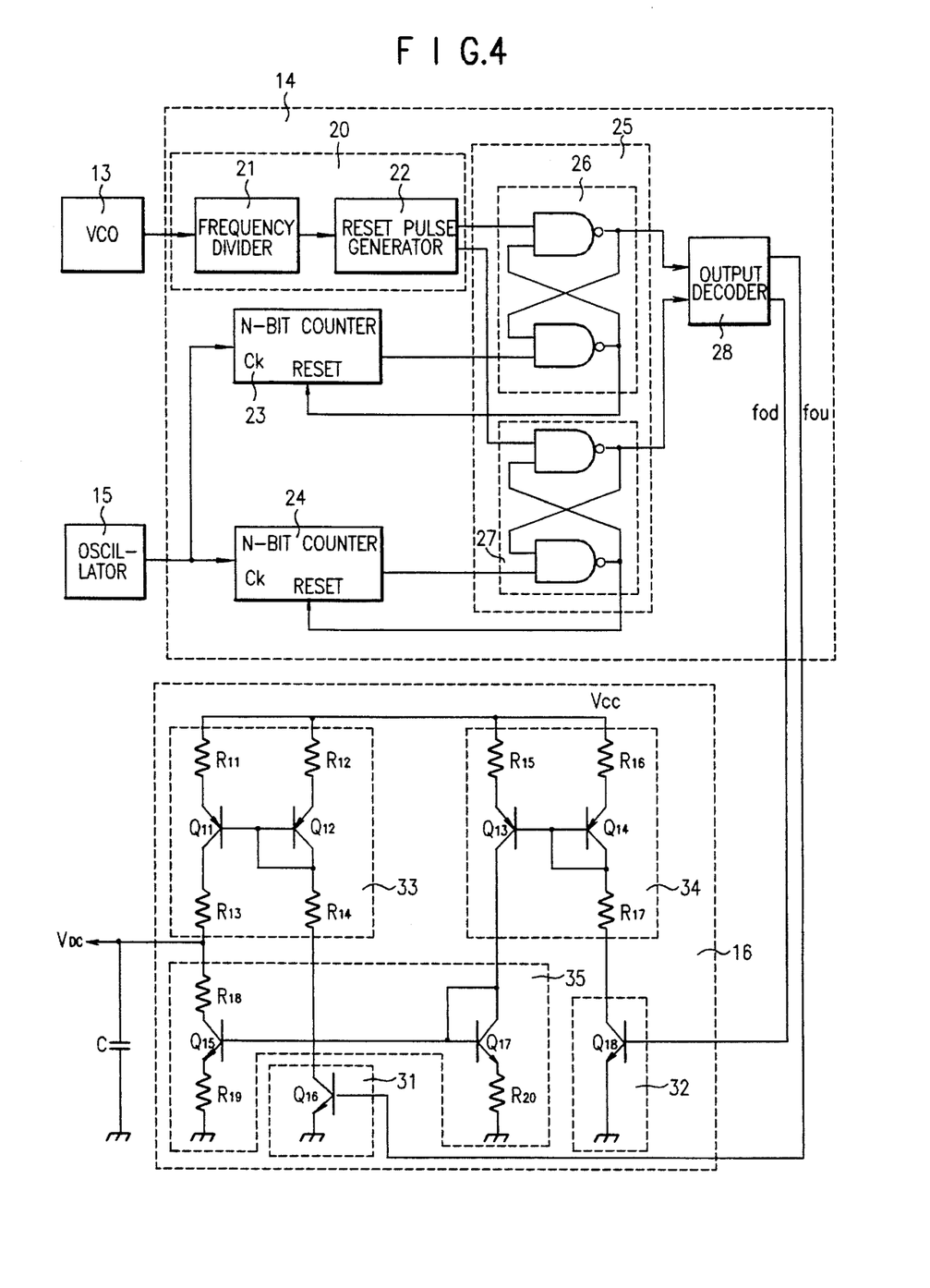
FIG. 4 is a detailed circuit diagram of the frequency discriminating portion and V-I converter of FIG. 3.

As shown in FIG. 4, frequency discriminating portion 14 comprises a resetting portion 20 for generating first and second reset pulses RS1 and RS2 using pre-controlled center frequency f0' output from VCO 13, N-bit counters 23 and 24 for counting a reference clock corresponding to desired center frequency f0 output from oscillator 15, a latch 25 for receiving and latching first and second reset pulses RS1 and RS2 output from resetting portion 20 and signals output from first and second N-bit counters 23 and 24 and for resetting N-bit counters 23 and 24, and an output decoder 28 for decoding the signals output from latch 25 and outputting an up/down pulse voltage f0u/f0d corresponding to the controlled frequency to V-I converter 16.

Resetting portion 20 comprises a frequency divider 21 for dividing pre-controlled center frequency f0' output from VCO 13 in two. Resetting portion 20 also comprises a reset pulse generator 22 for generating first and second rest pulses RS1 and RS2 from the frequency divided by frequency divider 21.

First and second reset pulses RS1 and RS2 are produced at the zero crossing of the frequency signal divided by frequency divider 21. Specifically, first reset pulse RS1 is produced at a zero crossing where the frequency signal divided by frequency divider 21 rises from a lower level to a higher level, and second reset pulse RS2 is produced at a zero crossing where the frequency signal divided by frequency divider 21 falls from a higher level to a lower level.

Latch 25 comprises a flipflop 26 for receiving and latching reset pulse RS1 output from reset pulse generator 22 of resetting portion 20 and signals output from N-bit counter 23, for outputting the latched signals to output decoder 28, and for resetting N-bit counter 23. Latch 25 also comprises a flipflop 27 for receiving and latching second reset pulse RS2 output from reset pulse generator 22 of resetting portion 20 and signals output from N-bit counter 24, for outputting the latched signals to output decoder 28, and for resetting N-bit counter 24.

As shown in FIG. 4, V-I converter 16 comprises a switching portion 31 switched according to up pulse voltage f0u output from frequency discriminating portion 14, a switching portion 32 switched according to down pulse voltage f0d output from frequency discriminating portion 14, a current mirror 33 coupled to power Vcc and capacitor C and operated by switching portion 31 for outputting a DC voltage to center frequency controlling port A of band-pass filter 11 via capacitor C, a current mirror 34 coupled to power Vcc and operated by switching portion 32, and a current mirror 35 coupled to current mirrors 33 and 34 and capacitor C for outputting a DC voltage to center frequency controlling port A of band-pass filter 11 via capacitor C.

Switching portion 31 comprises an npn transistor Q16 which receives pulse voltage f0u output from frequency discriminating portion 14 at its base input. The collector of npn transistor Q16 is coupled to current mirror 33 and the emitter of npn transistor Q16 is coupled to the ground.

Switching portion 32 comprises an npn transistor Q18 which receives down pulse voltage f0d output from frequency discriminating portion 14 at its base input. The collector of npn transistor Q18 is coupled to current mirror 34 and the emitter of npn transistor Q18 is coupled to the ground.

Current mirror 33 comprises a pnp transistor Q12 whose emitter is coupled to power Vcc via resistor R12 and whose base and collector are coupled to the collector of npn transistor Q16 via resistor R14, and a pnp transistor Q11 whose emitter is coupled to power Vcc via resistor R11, whose base is coupled to the base and collector of pnp transistor Q12, and whose collector is coupled to capacitor C and current mirror 35 via resistor R13.

Current mirror 34 comprises a pnp transistor Q14 whose emitter is coupled to power Vcc via resistor R16 and whose base and collector are coupled to the collector of npn transistor Q18 via resistor R17, and a pnp transistor Q13 whose emitter is coupled to power Vcc via resistor R15, whose base is coupled to the base and collector of pnp transistor Q14, and whose collector is coupled to current mirror 35.

Current mirror 35 comprises an npn transistor Q17 whose collector and base are coupled to the collector of pnp transistor Q13 of current mirror 34 and whose emitter is coupled to the ground via resistor R20, and an npn transistor Q15 whose collector is coupled to the collector of pnp transistor Q11 of current mirror 33 via resistors R13 and R18 and to capacitor C via resistor R18, whose base is coupled to the base and collector of npn transistor Q17, and whose emitter is coupled to the ground via resistor R19.

The operation of the non-adjusting band-pass filter of the present invention will now be described with reference to FIGS. 5A and 5B.

Figure 5A:
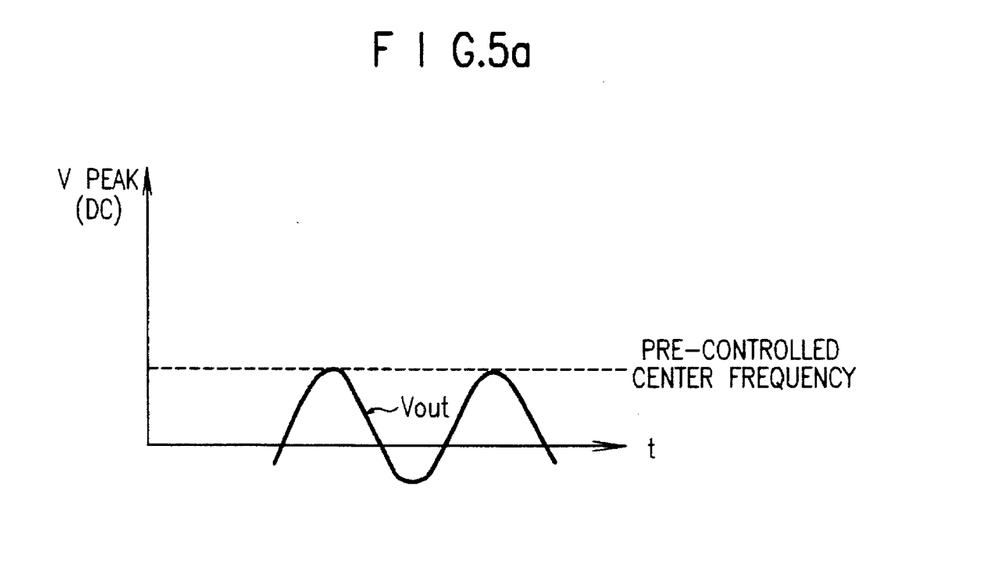
FIG. 5A is a diagram of the operation of the peak detector of the present invention.

As shown in FIG. 5A, a signal filtered and output from band-pass filter 11 is converted into a DC voltage proportional to a peak by peak detecting portion 12, and output to VCO 13. The DC voltage output from peak detecting portion 12 corresponds to center frequency f0' from VCO 13. Here, center frequency f0' is a center frequency prior to frequency band control.

Oscillator 15 generates a reference clock corresponding to desired center frequency f0 and outputs the reference clock to frequency discriminating portion 14. Frequency discriminating portion 14 detects the state of pre-controlled center frequency f0' output from VCO 13 according to desired center frequency f0 of the reference clock output from oscillator 15, so as to output an up/down pulse voltage corresponding to a control frequency for obtaining desired center frequency f0. This up/down pulse voltage controls band-pass filter 11 via V-I converter 16.

Figure 5B:
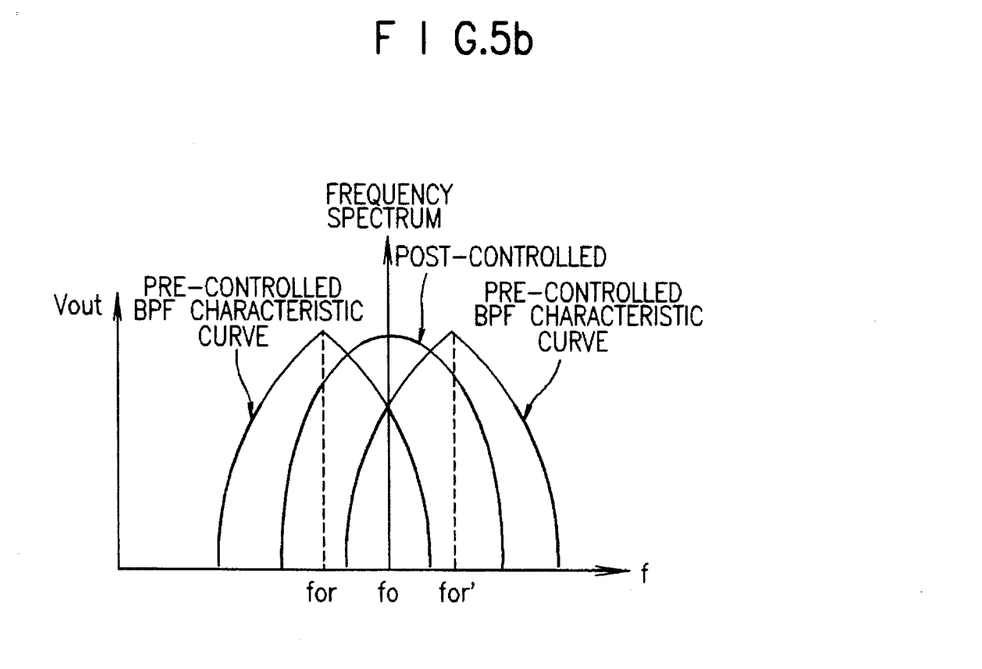
FIG. 5B is a diagram of the control of center frequency of the present invention.

As shown in FIG. 5B, when pre-controlled center frequency for output from VCO 13 is lower than desired center frequency f0, frequency discriminating portion 14 produces a up pulse f0u. A voltage corresponding thereto is converted into a current by V-I converter 16 and accumulated in capacitor C. The accumulated and increased currents of capacitor C increase the internal current of band-pass filter 11. This also increases center frequency f0' of band-pass filter 11, thereby filtering it to desired center frequency f0.

As shown in FIG. 5B, when pre-controlled center frequency f0r' output from VCO 13 is higher than desired center frequency f0, frequency discriminating portion 14 produces a down pulse f0d. A voltage corresponding thereto is converted into a current by V-I converter 16 and discharges the currents accumulated in capacitor C. The discharged and decreased currents of capacitor C decrease the internal current of band-pass filter 11. This also decreases center frequency f0' of band-pass filter 11, thereby filtering it to desired center frequency f0. The operation of frequency discriminating portion 14 and V-I converter 16 will be described with reference to FIGS. 6A–6J and 7A–7J.

First, the case where pre-controlled center frequency f0' output from band-pass filter 11 is lower than desired center frequency f0 will be explained with reference to FIGS. 6A–6J.

Figure 6A:
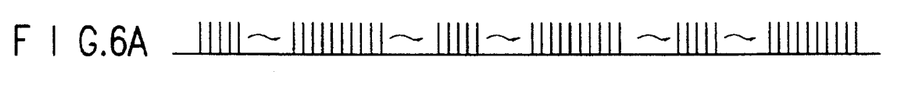
FIGS. 6A–6J are waveform diagrams of the respective portions of FIG. 4.
Figure 6B:
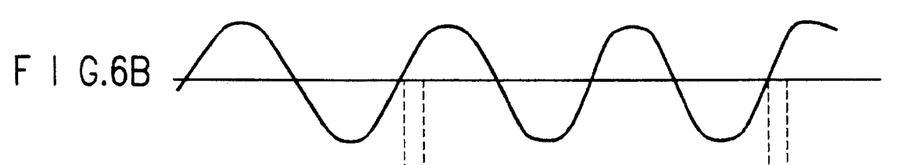
Figure 6C:
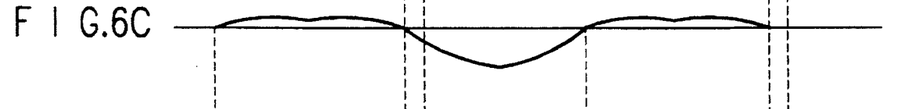
Figure 6D:
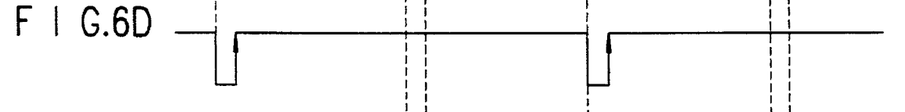
Figure 6E:
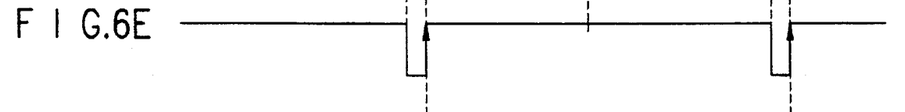

When pre-controlled center frequency f0' output from bandpass filter 11 is lower than desired center frequency f0, the output level of band-pass filter 11 is also low and the frequency of VCO 13 thus decreases as shown in FIG. 6B. Pre-controlled center frequency f0' output from VCO 13 is input to resetting portion 20 so that first and second reset pulses RS1 and RS2 are output. More specifically, pre-controlled center frequency f0' output from VCO 13 of FIG. 6B is input to frequency divider 21 and divided into two. This result is output as a signal shown in FIG. 6C. The divided-into-two frequency signal output from frequency divider 21 is input to reset pulse generator 22, producing first and second reset pulses RS1 and RS2 as shown in FIGS. 6D and 6E. Here, first reset pulse RS1 is produced at a zero crossing where the divided-into-two frequency signal rises from a lower level to a higher level, as shown in FIG. 6D, second reset pulse RS2 at a zero crossing where the frequency signal falls from a higher level to a lower level, as shown in FIG. 6E. First and second reset pulses RS1 and RS2 are input to and latched by flipflops 26 and 27 of latch 25, respectively. Then, the pulses are input to N-bit counters 23 and 24, resetting them.

After being reset according to the signals input from flipflops 26 and 27, N-bit counters 23 and 24 count reference clocks corresponding to desired center frequency f0 output from oscillator 15, as shown in FIG. 6A. Here, the counting value N of N-bit counters 23 and 24 is set to correspond to desired center frequency f0. Because pre-controlled center frequency f0' is lower than desired center frequency f0, the half period of the signal output from VCO 13 becomes greater than the counting value N corresponding to desired center frequency f0.

Figure 6F:
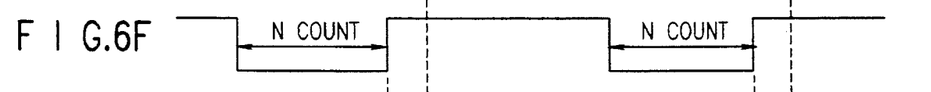
Figure 6G:
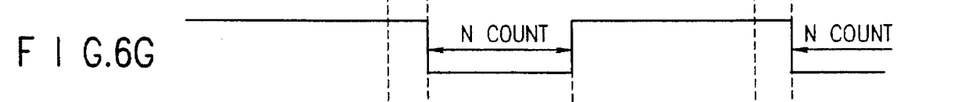

In other words, the signal output from N-bit counter 23 reset by first reset pulse RS1 is made so that the counting value N corresponds to desired center frequency f0, as shown in FIG. 6F. The signal output from N-bit counter 24 reset by second reset pulse RS2 is made so that the counting value N corresponds to desired center frequency f0, as shown in FIG. 6G. The signals output from N-bit counters 23 and 24 are input and latched by flipflops 26 and 27 of latch 25, and then decoded by output decoder 28 to be output as up/down pulse voltages f0u and f0d.

Figure 6H:
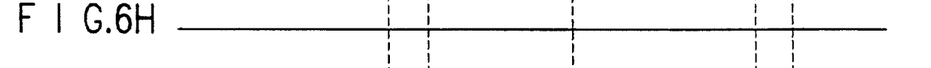
Figure 6I:
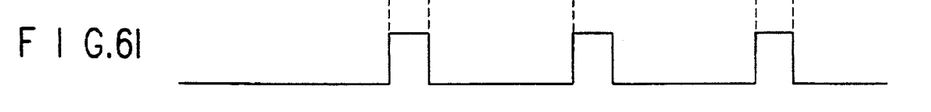

Output decoder 28 decodes the input signals to thereby output a down pulse f0d which is a lower level as shown in FIG. 6H, and an up pulse f0u which is a positive pulse as large as the state where the output signals of N-bit counters 23 and 24 all are in higher levels, as shown in FIG. 6I.

In this state, npn transistor Q16 of switching portion 31 of V-I converter 16 is turned on and, in turn, pnp transistors Q11 and Q12, current mirror 33, are turned on. Meanwhile, npn transistor Q18 of switching portion 32 is turned off so that pnp transistors Q13 and Q14 and npn transistors Q15 and Q17 of current mirrors 34 and 35 are turned off. Therefore, pnp transistor Q11 supplies currents to capacitor C.

Figure 6J:
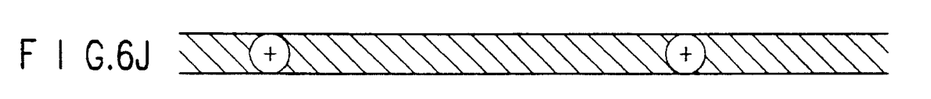

Capacitor C accumulate the currents supplied via pnp transistor Q11 so that voltage VDC is increased as shown in FIG. 6J. The increased voltage is input to center frequency controlling port A of band-pass filter 11 to thereby increase center frequency f0' of band-pass filter 11. This obtains desired center frequency f0 for performing filtering.

The case where pre-controlled center frequency f0' output from band-pass filter 11 is higher than desired center frequency f0 will now be described with reference to FIG. 7A–7J.

Figure 7A:
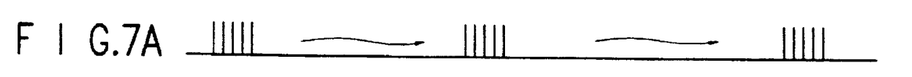
FIGS. 7A–7J are waveform diagrams of the respective portions of FIG. 4.
Figure 7B:
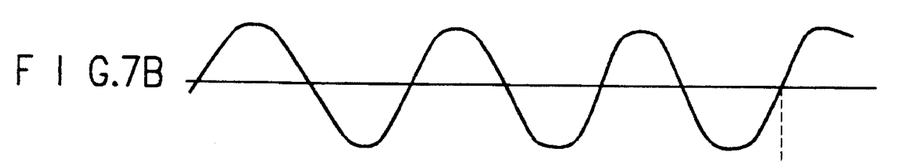
Figure 7C:
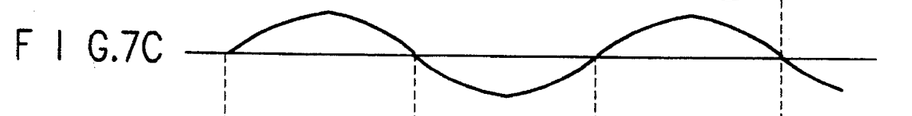

When pre-controlled center frequency f0' is higher than desired center frequency f0, the output level of band-pass filter 11 is also high and the frequency of VCO 13 thus increases as shown in FIG. 7B. Pre-controlled center frequency f0' output from VCO 13 is input to resetting portion 20 so that first and second reset pulses RS1 and RS2 are output.

Figure 7D:
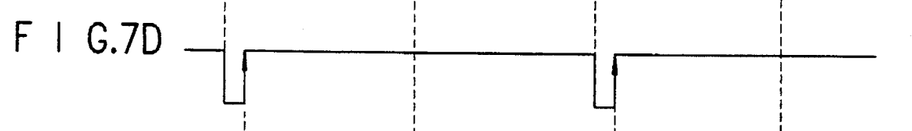
Figure 7E:
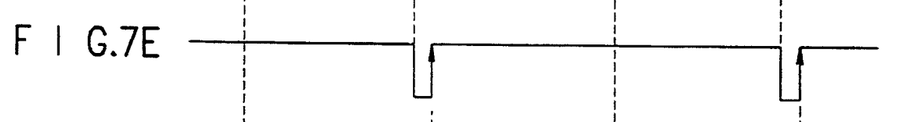

More specifically, pre-controlled center frequency f0' output from VCO 13 of FIG. 6B is input to frequency divider 21 and divided into two. This result is output as a signal shown in FIG. 7C. The divided-into-two frequency signal output from frequency divider 21 is input to reset pulse generator 22, thereby producing first and second reset pulses RS1 and RS2 as shown in FIGS. 7D and 7E. Here, first reset pulse RS1 is produced at a zero crossing where the divided-into-two frequency signal rises from a lower level to a higher level, as shown in FIG. 7D, and second reset pulse RS2 is produced at a zero crossing where the frequency signal falls from a higher level to a lower level, as shown in FIG. 7E. First and second reset pulses RS1 and RS2 are input to and latched by flipflops 26 and 27 of latch 25, respectively. Then, the pulses are input to N-bit counters 23 and 24, resetting them.

After being reset according to the signals input from flipflops 26 and 27, N-bit counters 23 and 24 count reference clocks corresponding to desired center frequency f0 output from oscillator 15, as shown in FIG. 7A. Here, the counting value N of N-bit counters 23 and 24 is set to correspond to desired center frequency f0. Because pre-controlled center frequency f0' is higher than desired center frequency f0, the half period of the signal output from VCO 13 becomes smaller than the counting value N corresponding to desired center frequency f0.

Figure 7F:
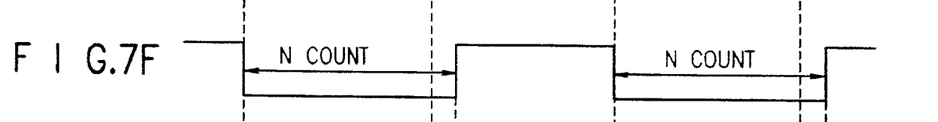
Figure 7G:
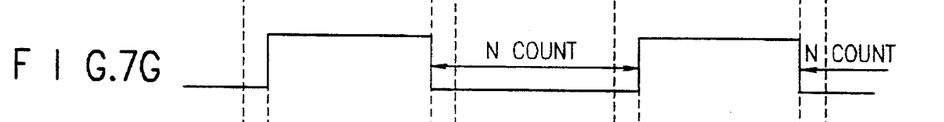

In other words, the signal output from N-bit counter 23 reset by first reset pulse RS1 is made so that the counting value N corresponds to desired center frequency f0, as shown in FIG. 7F. The signal output from N-bit counter 24 reset by second reset pulse RS2 is made so that the counting value N corresponds to desired center frequency f0, as shown in FIG. 7G. The signals output from N-bit counters 23 and 24 are input to and latched by flipflops 26 and 27 of latch 25, and then decoded by output decoder 28 to be output as up/down pulse voltages f0u and f0d.

Figure 7H:
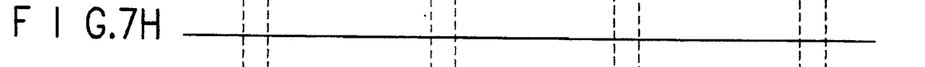
Figure 7I:
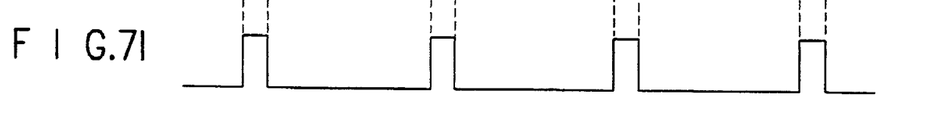

Output decoder 28 decodes the input signals to thereby output an up pulse f0u which is a lower level as shown in FIG. 7H, and a down pulse f0d which is a positive pulse as large as the state where the output signals of N-bit counters 23 and 24 all are in lower levels, as shown in FIG. 7I. In this state, npn transistor Q18 of switching portion 31 of V-I converter 16 is turned on and then pnp transistors Q13 and Q14 and npn transistors Q15 and Q17 current mirrors 34 and 35 are turned on. Meanwhile, npn transistor Q16 of switching portion 31 is turned off so that pnp transistors Q11 and Q12 of current mirrors 33 are turned off. Therefore, the currents accumulated in capacitor C are discharged via npn transistor Q15 of current mirror 35.

Figure 7J:
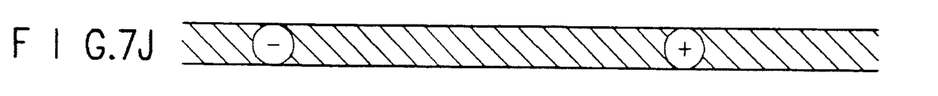

Capacitor C is discharged with the currents supplied via npn transistor Q15 so that voltage $V_{Dc}$ is decreased as shown in FIG. 7J. The decreased voltage is input to center frequency controlling port A of band-pass filter 11 to thereby reduce center frequency f0' of band-pass filter 11. This obtains desired center frequency f0 for performing filtering.

As described above, the non-adjusting band-pass filter of the present invention automatically controls and filters its center frequency to a desired center frequency, thereby reducing the number of processes and time to process associated with the control of the center frequency. Further, when the frequency discriminating circuit is implemented in a digital mode, the center frequency can be accurately controlled.

It will be apparent to those skilled in the art that various modifications and variations can be made in the non-adjusting band-pass filter of the present invention without departing from the spirit or scope of the invention. Thus, it is intended that the present invention cover the modifications and variations of this invention provided they come within the scope of the appended claims and their equivalents.

What is claimed is:

1. The band-pass filter system comprising:

a band-pass filter; and a frequency band controller for controlling which frequency band is passed by the band-pass filter by generating a corresponding up pulse voltage and a down pulse voltage according to a pre-controlled center frequency obtained from an output frequency of the band-pass filter to produce a control frequency for obtaining a desired center frequency of the band-pass filter, wherein the frequency band controller includes:

a peak detector for providing a DC voltage proportional to a peak of the output frequency of the band-pass filter, a voltage controlled oscillator for providing the pre-controlled center frequency according to the DC voltage provided by the peak detector, an oscillator for generating a reference clock corresponding to the desired center frequency, a frequency discriminating portion for comparing the pre-controlled center frequency provided by the voltage controlled oscillator and the desired center frequency corresponding to the reference clock to provide the up pulse voltage and the down pulse voltage, a V-I converter for converting the up pulse voltage and the down pulse voltage into a current, and a capacitor for performing charging/discharging according to the current output from the V-I converter and for outputting a result of the charging/discharging to a frequency band-pass filter port of the band-pass filter.

2. The band-pass filter system as claimed in claim 1, wherein the frequency discriminating portion comprises:

resetting means for generating first and second reset pulses using the pre-controlled center frequency provided by the voltage controlled oscillator;

first and second counters for counting the reference clock corresponding to the desired center frequency;

a latch for receiving and latching the first and second reset pulses generated by the resetting means and signals output from the first and second counters, and for resetting the first and second counters; and an output decoder for decoding signals output from the latch and for outputting the up pulse voltage and the down pulse voltage to the V-I converter.

3. The band-pass filter system as claimed in claim 2, wherein the resetting means comprises:

a frequency divider for dividing the pre-controlled center frequency provided by the voltage controlled oscillator into two; and a reset pulse generator for generating the first and second reset pulses from the frequency divided by the frequency divider.

4. The band-pass filter system as claimed in claim 3, wherein the first and second reset pulses are produced at a zero crossing of the frequency signal divided by the frequency divider.

5. The band-pass filter system as claimed in claim 4, wherein the first reset pulse is produced at a zero crossing where the frequency signal divided by the frequency divider rises from a lower level to a higher level.

6. The band-pass filter system as claimed in claim 4, wherein the second reset pulse is produced at a zero crossing where the frequency signal divided by the frequency divider falls from a higher level to a lower level.

7. The band-pass filter system as claimed in claim 2, wherein the latch comprises:

a first flipflop for receiving and latching the first reset pulse generated by the resetting means and signals output from the first counter, for outputting the latched signals to the output decoder, and for resetting the first counter; and a second flipflop for receiving and latching the second reset pulse generated by the resetting means and signals output from the second counter, for outputting the latched signals to the output decoder, and for resetting the second counter.

8. The band-pass filter system as claimed in claim 1, wherein the V-I converter comprises:

first switching means switched according to the up pulse voltage provided by the frequency discriminating portion;

a second switching means switched according to the down pulse voltage provided by the frequency discriminating portion;

a first current mirror coupled to a power supply and the capacitor and operated by the first switching means for providing a DC voltage to the center frequency controlling port of the band-pass filter via the capacitor;

a second current mirror coupled to the power supply and operated by the second switching means; and a third current mirror coupled to the first and second current mirrors and the capacitor for providing the DC voltage to the center frequency controlling port of the band-pass filter via the capacitor.

9. The band-pass filter system as claimed in claim 8, wherein the first switching means comprises an npn transistor which receives the up pulse voltage output from the frequency discriminating means as a base input and which includes a collector coupled to the first current mirror and an emitter coupled to ground.

10. The band-pass filter system as claimed in claim 8, wherein the second switching means comprises an npn transistor which receives the down pulse voltage output from the frequency discriminating means as a base input and which includes a collector coupled to the second current mirror and an emitter coupled to ground.

11. The band-pass filter system as claimed in claim 8, wherein the first current mirror comprises:

a first pnp transistor having an emitter coupled to the power supply and a base and a collector coupled to the first switching means; and a pnp transistor having an emitter coupled to the power supply, a base coupled to the base and the collector of the first pnp transistor, and a collector coupled to the capacitor and the third current mirror.

12. The band-pass filter system as claimed in claim 8, wherein the second current mirror comprises:

a first pnp transistor having an emitter coupled to the power supply and a base and a collector coupled to the second switching means; and a second pnp transistor having an emitter coupled to the power supply, a base coupled to the base and the collector of the first pnp transistor, and a collector coupled to the third current mirror.

13. The band-pass filter system as claimed in claim 8, wherein the third current mirror comprises:

a first npn transistor having a collector and a base coupled to the second current mirror and an emitter coupled to ground; and a second npn transistor having a collector coupled to the first current mirror and to the capacitor, a base coupled to the base and the collector of the first npn transistor, and an emitter coupled to the ground.

* * * * *